(12) United States Patent
Ma et al.

(10) Patent No.: US 6,630,871 B2
(45) Date of Patent: Oct. 7, 2003

(54) CENTER-MASS-REDUCED MICROBRIDGE STRUCTURES FOR ULTRA-HIGH FREQUENCY MEM RESONATOR

(75) Inventors: Qing Ma, San Jose, CA (US); Peng Cheng, Campbell, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/967,732

(22) Filed: Sep. 28, 2001

(65) Prior Publication Data

US 2003/0062961 A1 Apr. 3, 2003

(51) Int. Cl.[7] .................................................. H03B 5/30
(52) U.S. Cl. .................................................. 331/116 M
(58) Field of Search ................................ 331/154, 156, 331/116 M; 333/186, 197; 310/309

(56) References Cited

U.S. PATENT DOCUMENTS

| | | | | |
|---|---|---|---|---|
| 5,914,553 A | * | 6/1999 | Adams et al. | 310/309 |
| 5,976,994 A | * | 11/1999 | Nguyen et al. | 438/795 |
| 6,278,337 B1 | | 8/2001 | Chan et al. | 331/116 M |
| 6,391,675 B1 | * | 5/2002 | Ehmke et al. | 436/538 |
| 6,424,074 B2 | * | 7/2002 | Nguyen | 310/309 |
| 2002/0074897 A1 | * | 6/2002 | Ma et al. | 310/311 |
| 2002/0096967 A1 | * | 7/2002 | Ma et al. | 310/309 |

FOREIGN PATENT DOCUMENTS

| | | |
|---|---|---|
| WO | WO 00/71981 A1 | 11/2000 |
| WO | WO 01/61846 A1 | 8/2001 |

OTHER PUBLICATIONS

U.S. patent application Ser. No. 09/894,334, Ma et al., filed Jun. 27, 2001.
Nguyen, Clark T.–C., "High–Q Micromechanical Oscillators and Filters for Communications", 1977 IEEE Int'l Symposium on Circuits and Systems, Jun. 9–12, 1997 Hong Kong, pp. 2825–2828.
PCT International Search Report mailed Apr. 4, 2003 regarding co–pending PCT application No. PCT/US 02/31157 filed Sep. 27, 2002.

* cited by examiner

Primary Examiner—Terry D. Cunningham
Assistant Examiner—Quan Tra
(74) Attorney, Agent, or Firm—Blakely, Sokoloff, Taylor & Zafman LLP

(57) ABSTRACT

A micro-electromechanical (MEM) resonator is described that includes a substrate, a microbridge beam structure coupled to the substrate and at least one electrode disposed adjacent to the microbridge beam structure to induce vibration of the beam. The microbridge beam structure includes support sections and a beam formed between the support sections. The center region of the beam has a mass that is less than the mass of regions of the beam adjacent to the support sections.

32 Claims, 7 Drawing Sheets

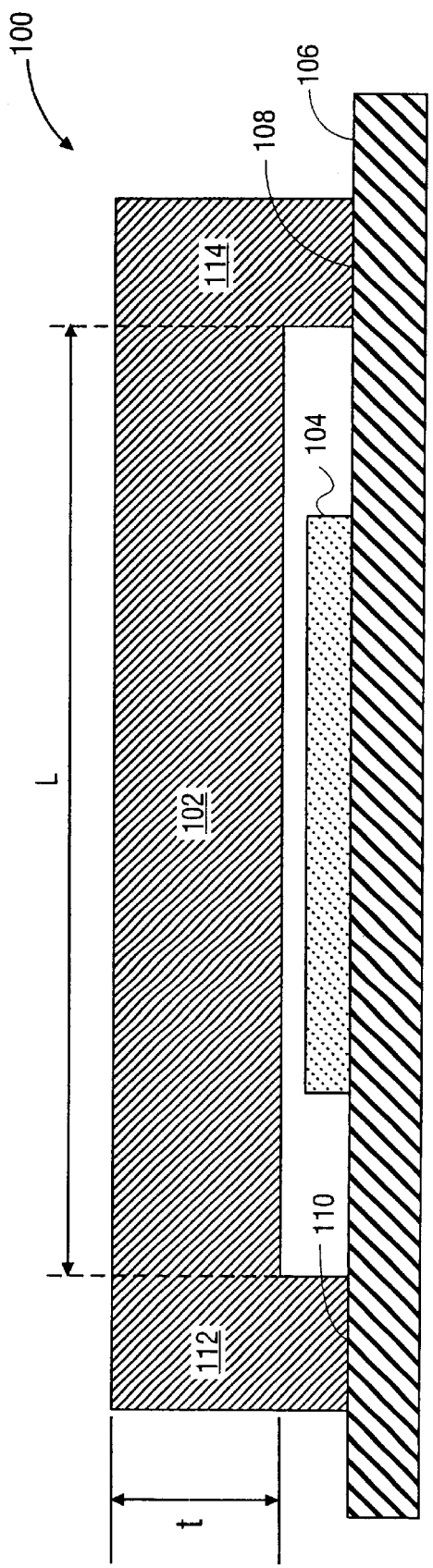
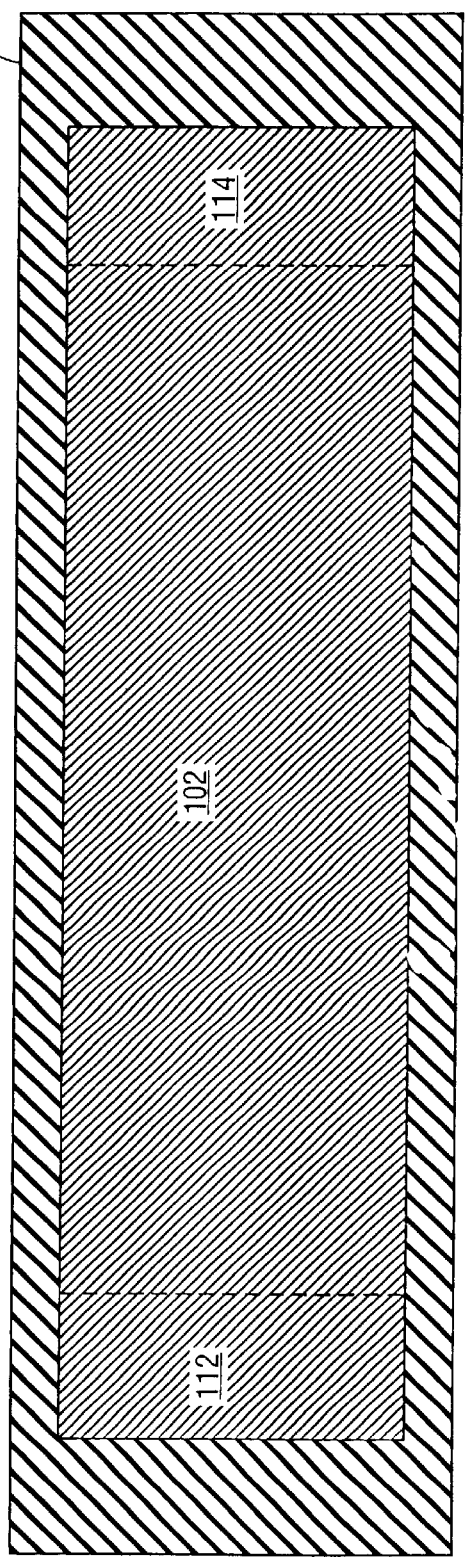

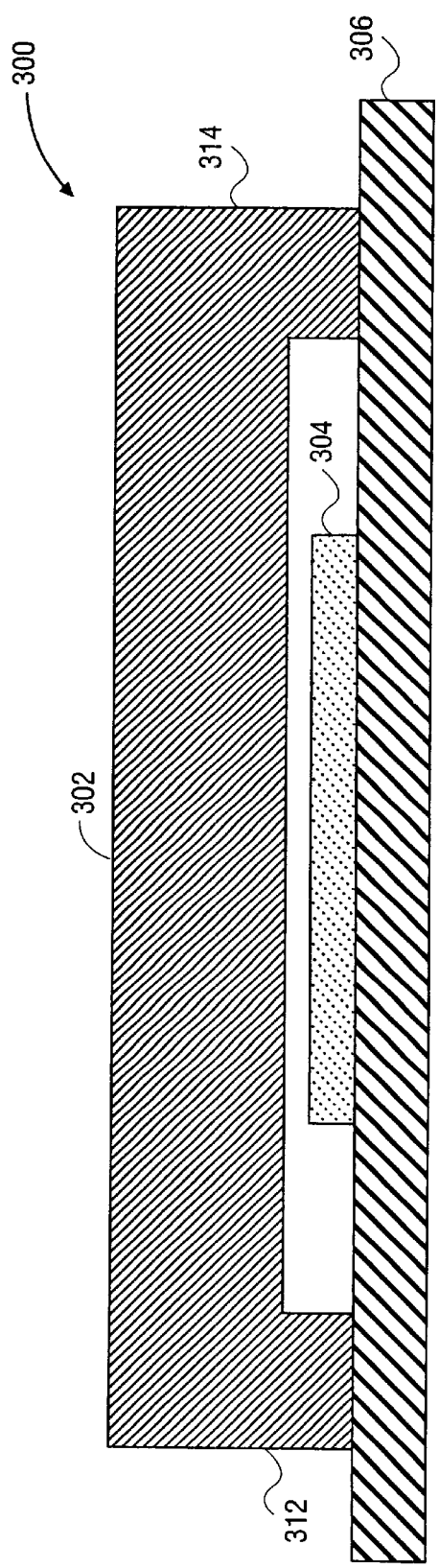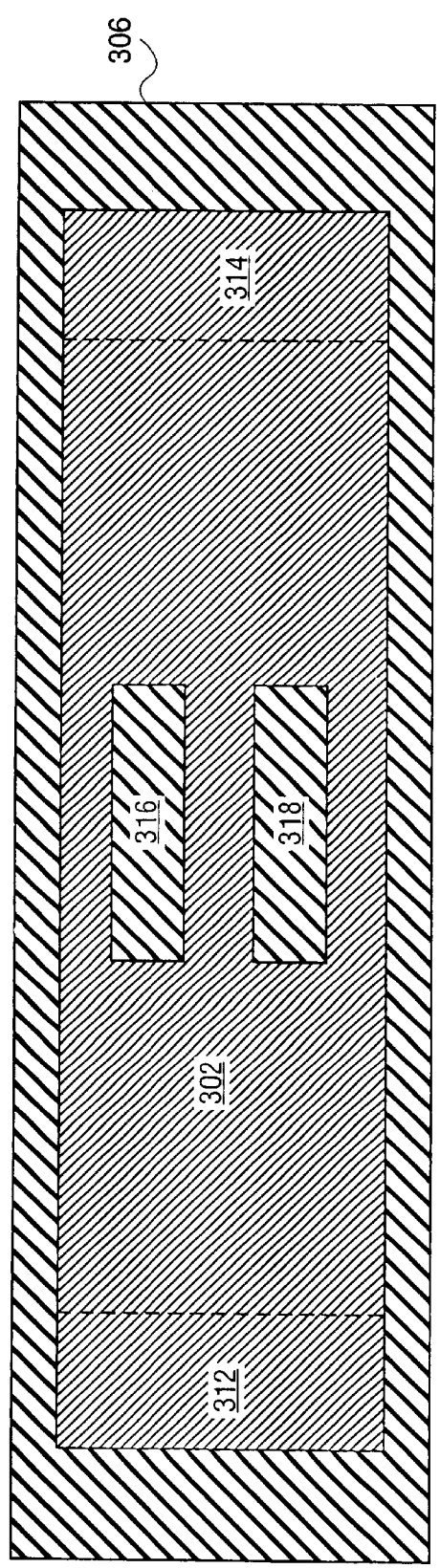

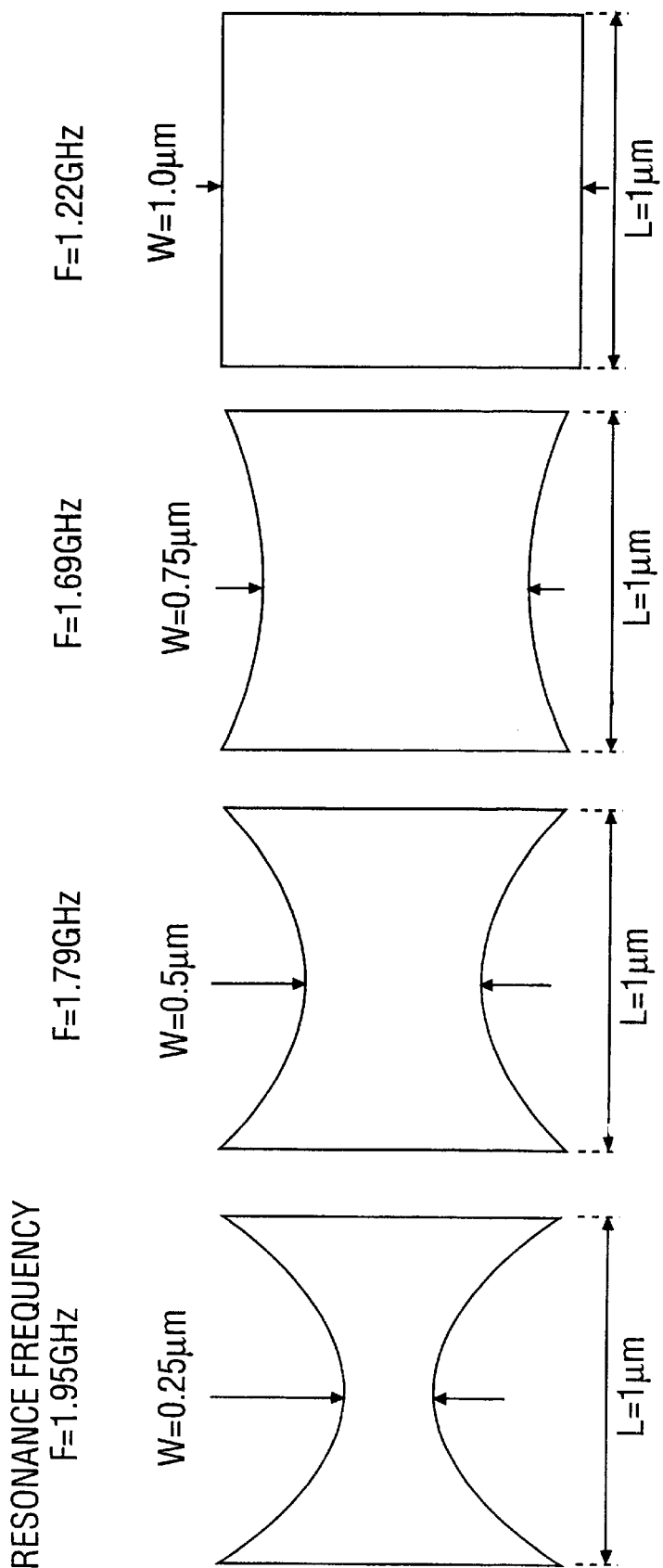

US 6,630,871 B2

CENTER-MASS-REDUCED MICROBRIDGE STRUCTURES FOR ULTRA-HIGH FREQUENCY MEM RESONATOR

BACKGROUND

1. Field of the Invention

The present invention generally relates to micro-electromechanical (MEM) structures, and in particular, to MEM resonators.

2. Description of the Related Art

Communication systems generally require partitioning of the electromagnetic frequency spectrum. Communication transceiver devices therefore must be capable of high frequency selectivity, i.e., capable of selecting a given frequency band while rejecting all others. Frequency-selective devices, such as filters, oscillators and mixers are therefore some of the most important components within a transceiver and the quality of the devices generally dictates the overall architecture of a given transceiver.

In wireless communication devices (e.g., radio frequency (RF) devices and cellular communication devices), resonators are typically used for signal filtering and generation purposes. Currently, discrete crystals are often used to make the resonators. Such off-chip resonators are typically implemented at the board level and therefore impede the ultimate miniaturization of portable transceivers.

To miniaturize portable transceivers, micro-electromechanical (MEM) resonators have been contemplated, for example, for use in bandpass filters and reference oscillators. However, the existing MEM resonators may not provide adequate resonance frequencies high enough for wireless communication applications.

BRIEF DESCRIPTION OF THE DRAWINGS

The features, aspects, and advantages of the invention will become more thoroughly apparent from the following detailed description, appended claims, and accompanying drawings in which:

FIG. 1A shows a cross-sectional side elevational view of a MEM resonator with a rectangular microbridge beam.

FIG. 1B shows a top view of the MEM resonator of FIG. 1A.

FIG. 3A shows a cross-sectional side elevational view of a MEM resonator according to a second embodiment of the invention.

FIG. 3B shows a top view of the MEM resonator of FIG. 3A.

FIGS. 7A–7D show the effect of center section width on the resonance frequency.

DETAILED DESCRIPTION

Figure 2A:
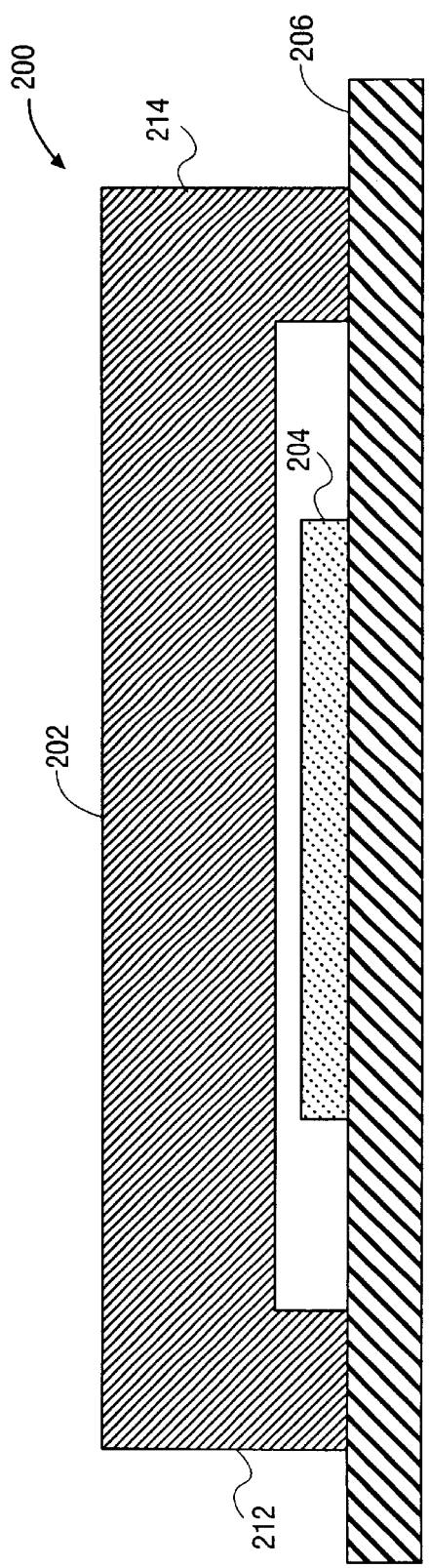
FIG. 2A shows a cross-sectional side elevational view of a MEM resonator according to a first embodiment of the invention.

In the following description, specific details are set forth in order to provide a thorough understanding of the present invention. However, it will be apparent to one skilled in the art that the present invention may be practiced without these specific details. In other instances, well-known circuits, structures and techniques have not been shown in detail in order to avoid obscuring the present invention.

A micro-electromechanical (MEM) resonator is described. In one embodiment, the resonator includes a microbridge beam structure having support sections and a horizontal beam formed therebetween. The center region of the beam has a mass that is less than the mass of regions of the beam adjacent to the support sections. By having less mass at the center region of the beam, higher resonance frequency can be achieved without reducing the size (e.g., length and thickness of the beam structure) of the resonator.

FIGS. 1A and 1B depict a MEM resonator 100 with a rectangular microbridge beam section 102. The MEM resonator includes a microbridge beam structure which comprises the horizontal beam section 102 and support sections 112 and 114 anchored to the substrate on which the resonator is formed. The vibration of the resonator 100 is induced by a lateral gap capacitive transducer (a frequency stimulus). The capacitive transducer is formed by disposing electrode 104 adjacent the horizontal beam section 102 with, in this case, a gap between the electrode and the beam. In the illustrated embodiment, the electrode 104 is disposed underneath the horizontal beam section 102 to cause it to vibrate vertically with respect to the substrate 106 on which it is formed.

The MEM resonator is essentially a two-terminal device having two terminals corresponding to electrode and beam, respectively, between which the impedance is very high at all frequencies other than the resonance frequency. At the resonance frequency, the resistance between the terminals becomes very low. In an example of use in a filter, an input signal may be passed at the resonance frequency.

It is appreciated that one desired performance of a resonator (such as resonator 100) is the ability to limit the resonating frequencies for which the resonator will vibrate and produce a mechanical signal. In the case of an oscillator serving, for example, as part of a clock circuit, it is important that the resonator-based oscillator vibrate at a target clock frequency. In the case of a filter, it may be desirable for a resonator to resonate at target frequencies and pass an input signal, while not vibrating at other frequencies and thus rejecting other input signals.

The resonance frequency of a MEM resonator with a rectangular beam is function of, among other things, the length of the horizontal beam section. The resonance frequency (F) of a resonator with a rectangular beam may be approximated as follows:

$$F = \frac{1.1t}{L^2}\sqrt{\frac{E}{\rho}} \quad (1)$$

where t represents the thickness of the microbridge beam;
L represents the length of the microbridge beam;
E represents the Young's modulus of the beam material; and
ρ represents the density of the beam material.

In certain applications, very high frequency (VHF) or ultra high frequency (UHF) vibrating MEM resonators, for example, for use in wireless communication devices, may be desired. Equation (1) shows that the resonance frequency is inversely proportional to the square of the length of the microbridge beam. Accordingly, shortening the beam length L may be effective in achieving high-speed oscillation. However, a resonator must be fabricated extremely small to achieve, for example, ultra-high frequencies (e.g., greater than 200 MHz). For example, the length of horizontal beam section of an ultra high frequency resonator having a resonance frequency of 1 GHz will be in the order of less than 3 microns (em). To produce 5 GHz, the length of horizontal beam section of MEM resonator may be in the order of about 0.2 microns ($\mu$m).

One limitation as to how small these resonators can be fabricated is determined by the existing lithographic technology. For example, with the current technology, about 0.2 microns (i.e., the length of the microbridge beam) may be the smallest size achievable. Another limitation as to how small these resonators may be fabricated is determined by the power handling capacity requirements. The power handling capacity of a resonator is proportional to the length of the microbridge beam. In a vertically vibrating configuration, the power handling capacity is proportional to the overlapping area between the horizontal beam section the electrode lying underneath.

Therefore, continued miniaturization of a resonator, for example, by reducing the length of its microbridge beam, in an effort to increase frequency even further, may not be desired since reduction in the length of the microbridge beam will adversely affect the power handling capacity of the MEM resonator. In at least some of the existing MEM resonators, if the length of the beam is reduced even further, the resonator may not provide adequate power for intended applications.

For on-chip resonators, it may be desirable to increase the resonance frequency without reducing the length of the microbridge beam. It has been found that an increase in the stiffness-to-mass ratio of the microbridge beam structure will increase the resonance frequency of a MEM resonator. It has also been found that the mass at the center section of the microbridge beam contributes most to the inertia and the mass near the support structures contributes most to the effective spring constant. Accordingly, the stiffness-to-mass ratio of a rectangular-shaped-beam MEM resonator may be effectively increased by reducing the mass at the center section of the microbridge. This means that higher resonance frequency may be achieved by reducing the mass at the center section without reducing the length of the microbridge beam. Alternatively or in addition to, higher resonance frequency may also be achieved by increasing the effective spring constant. One way the effective spring constant of the microbridge beam structure may be increased is by making the regions of the beam adjacent to the support sections wider.

According to one aspect of one embodiment, by reducing the mass at the center section of the microbridge beam structure or by increasing the mass near the support sections, or by doing both, the resonance frequency can be increased without compromising its power handling capacity.

Figure 2B:
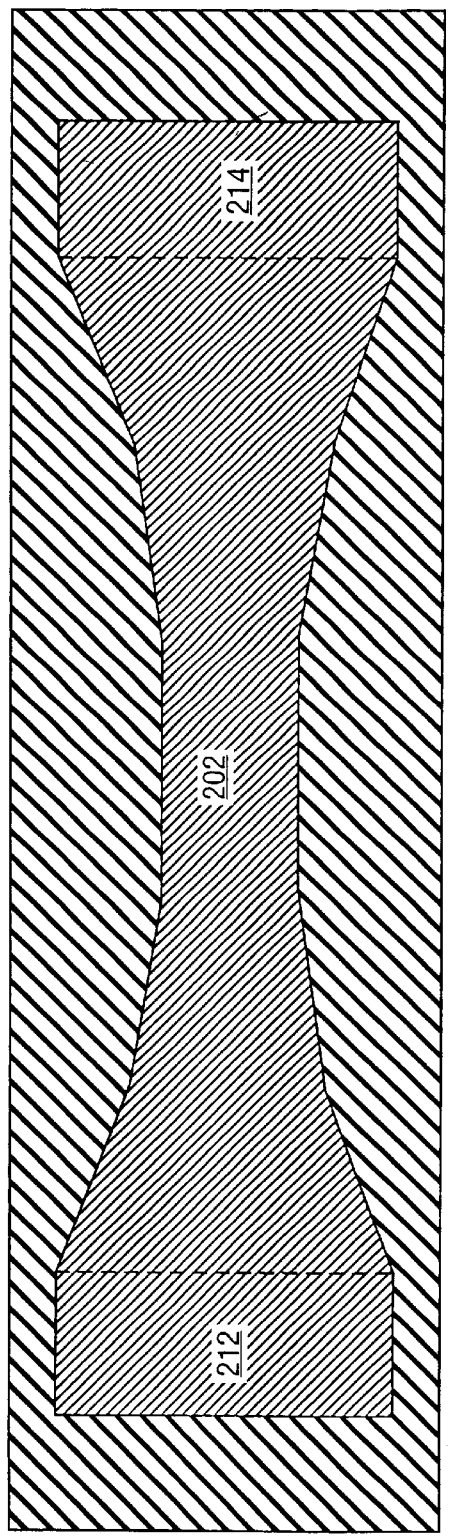
FIG. 2B shows a top view of the MEM resonator of FIG. 2A.

FIGS. 2A and 2B depict a MEM resonator 200 according to a first embodiment of the invention. The MEM resonator 200 includes a microbridge beam structure formed on a portion of substrate 206. Substrate 206 is, for example, a semiconductor (e.g., silicon) substrate suitable as a base structure for MEMS applications. It is appreciated that other substrates, such as glass (including silicon on insulator) and ceramic substrates may be suitable. Substrate 206 may have contact points (pads, terminals) disposed on its surface to which device structure (e.g., electrodes) may be formed. Conductive traces may also be disposed throughout the body of substrate to connect contact points on the substrate to one another or to another substrate. Substrate 206 may further have one or more device levels, including interconnect levels, formed thereon.

In this embodiment, the microbridge beam 202 is configured to vibrate vertically with respect to the substrate 206 on which it is formed. The vibration of the microbridge beam 202 may be induced by a lateral gap capacitive transducer (a frequency stimulus). In one embodiment, the capacitive transducer is formed by disposing a drive electrode 204 adjacent to the microbridge beam with, in this case, a gap between the drive electrode and the beam.

Referring to FIGS. 2A and 2B, the microbridge beam structure includes support sections 212, 214 integrally formed with a horizontal beam section 202 disposed above the electrode. In one embodiment, microbridge beam structure is formed by a series of deposition, etch patterning and release process. The microbridge beam structure may be constructed of polycrystalline silicon. However, other suitable material may also be used. In terms of forming a beam structure, for example, the material for the beam structure may be formed over a sacrificial material and the sacrificial material may then be removed.

In the illustrated embodiment, high resonance frequency is achieved by narrowing the center section of the microbridge beam 202. For the fundamental vertical vibration mode (up-down), the stiffness-to-mass ratio can be increased by narrowing the center section of the bridge. It has been found that the mass at the center section contributes most to the inertia, but the cross-section near the support contributes most to the effective spring constant. Therefore, by narrowing the center section of the beam and/or increasing the mass adjacent to the support sections, the stiffness-to-mass ratio of the microbridge beam structure may be increased. Accordingly, the center mass-reduced beam has higher resonance frequency than if the beam were fabricated in a rectangular configuration.

As discussed above, in vertically vibrating configuration, the power handling capacity is related to the overlapping area between the horizontal beam section and the electrode lying underneath. Thus, when the width near the center of the beam is reduced, the overlapping area between the beam and the electrode will also be reduced. However, this reduction in the overlapping area may be compensated by increasing the width of the beam near the support section so that its power handling capability is not sacrificed.

FIGS. 7A through 7D show the effect of center section width on the resonance frequency. The calculation is performed for a microbridge beam structure of 0.25 microns ($\mu$m) thickness and one micron in length. As illustrated in FIGS. 7A–7D, as the center width (W) decreases, for example, from one micron (FIG. 7D) to 0.25 micron (FIG. 7A), the resonance frequency increases from 1.22 GHz to 1.95 GHz. The amount of reduction in the center mass of the microbridge beam structure is proportional to the amount of resonance frequency increase in a resonator. Thus, given a resonator with a certain length, higher resonance frequency can be achieved by appropriately narrowing the width of the beam structure near its center.

As discussed above, the resonance frequency can also be increased by reducing the length of the resonator. However, the reduction in the length will negatively affect its power handling capacity. By reducing the center mass of the microbridge beam structure while increasing the width of the beam structure adjacent to the support section, a resonator can be configured to achieve higher resonance frequency without negatively affecting its power handling capacity.

FIGS. 3A and 3B depict a MEM resonator 300 according to a second embodiment. In this illustrated embodiment, the center-mass of the microbridge beam structure is reduced by forming one or more slots 316,318 at the center section of the beam 302. Although in the illustrated embodiment, two slots are shown; however any number of slots may be used (e.g., 1, 2, 3, etc). Additionally, the shape of slots is not limited to rectangular. The slots may formed in the horizontal beam section 302 by any suitable lithographic techniques during etch patterning process.

Figure 4A:
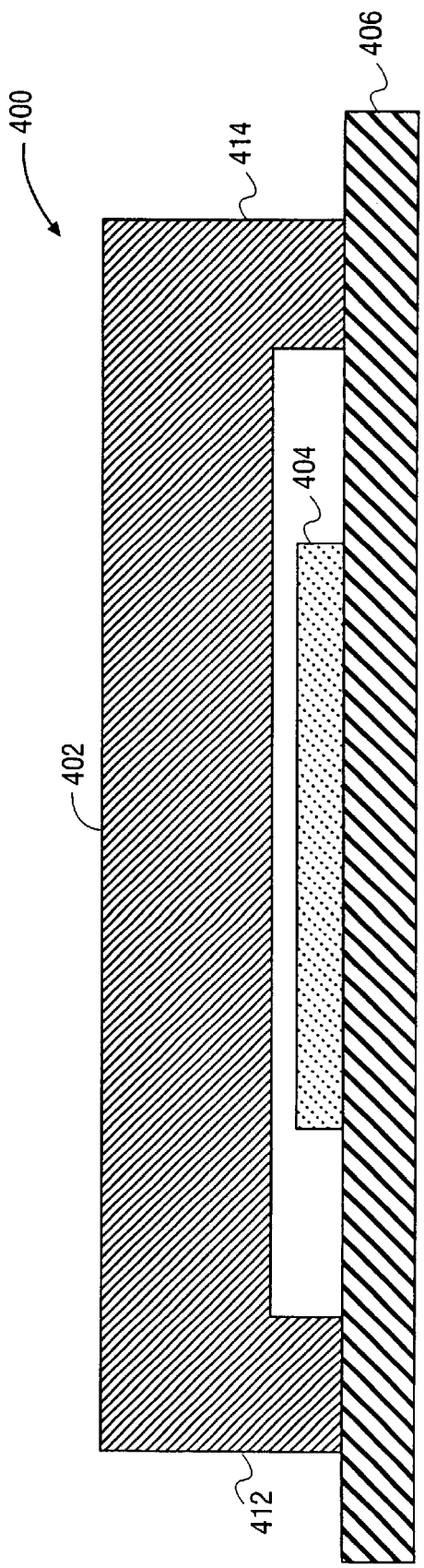
FIG. 4A shows a cross-sectional side elevational view of a MEM resonator according to a third embodiment of the invention.
Figure 4B:
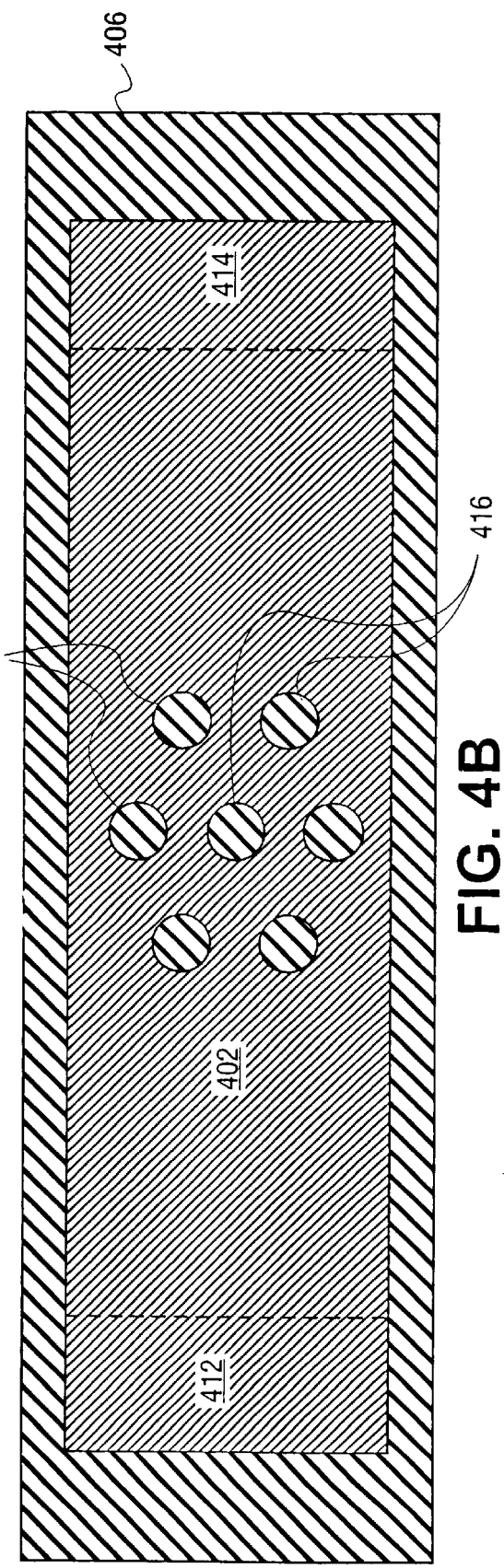
FIG. 4B shows a top view of the MEM resonator of FIG. 4A.

FIGS. 4A and 4B show another way of reducing the mass near the center of the microbridge beam 402. In this embodiment, the center mass is reduced by forming one or more holes 416 at or near the center section of the beam. In one embodiment, the hole density is higher at the center.

Figure 5A:
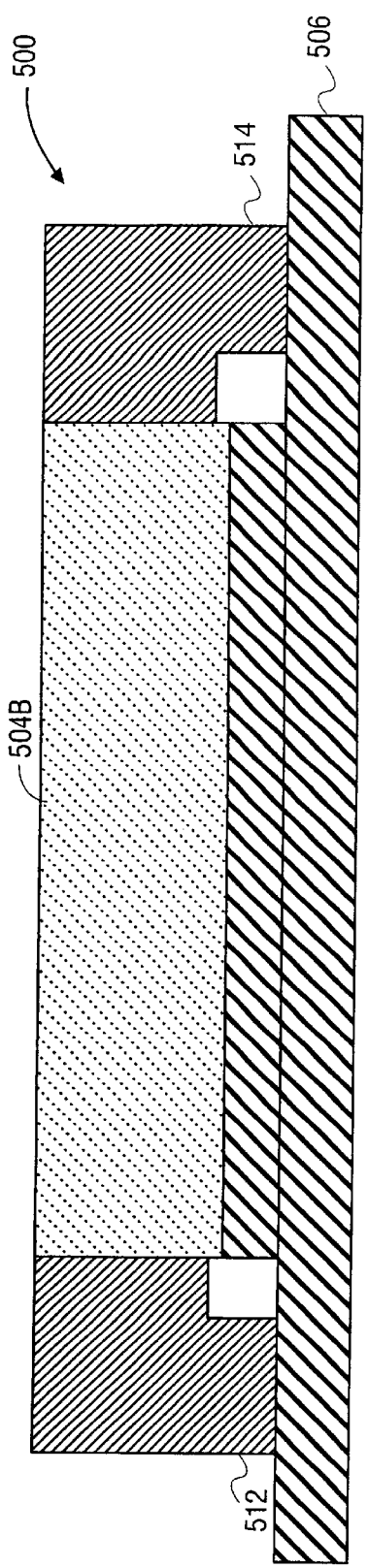
FIG. 5A shows a cross-sectional side elevational view of a MEM resonator according to a fourth embodiment of the invention.
Figure 5B:
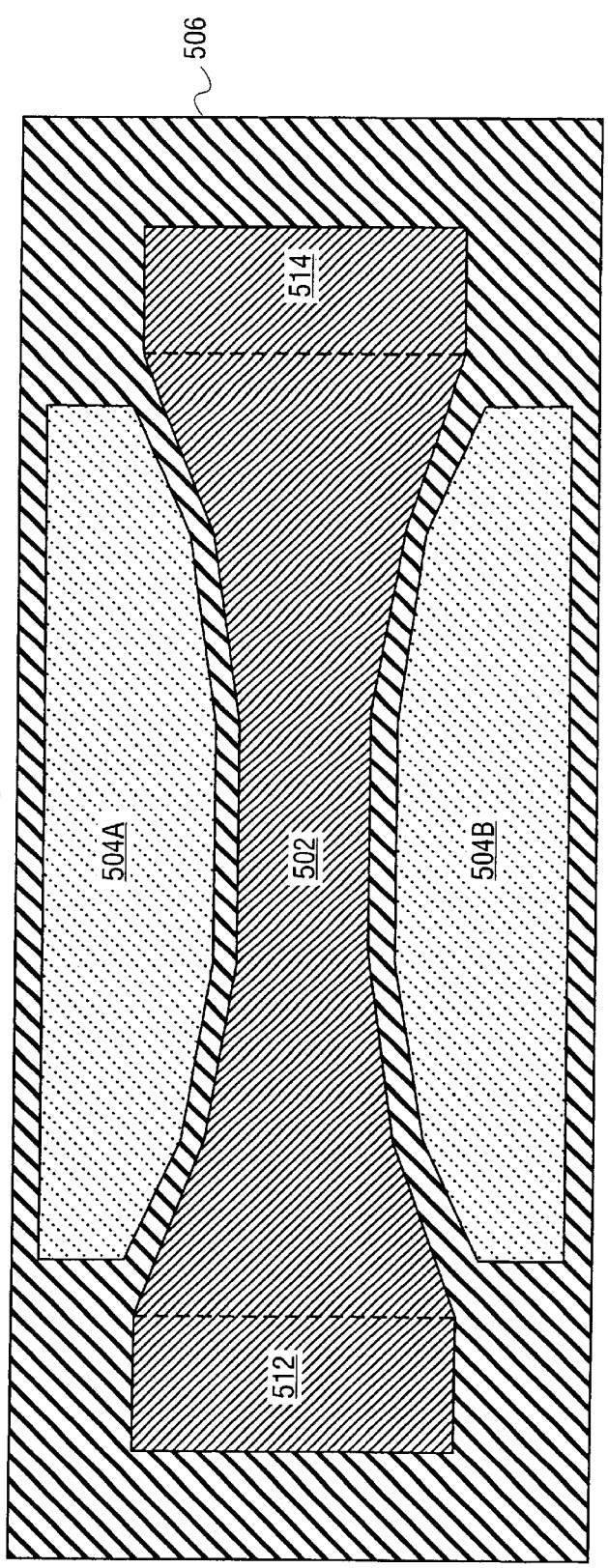
FIG. 5B shows a top view of the MEM resonator of FIG. 5A.

FIGS. 5A and 5B depict a MEM resonator 500 according to a fourth embodiment. In this illustrated embodiment, the horizontal beam section 502 vibrates horizontally, i.e., parallel to the substrate on which it is formed. The horizontal vibrations of the beam section 502 are induced by a lateral gap capacitive transducer. The capacitive transducer is formed by disposing a pair of electrodes 504A and 504B adjacent to the beam section 502 with gaps between the electrodes and the microbridge beam. In one implementation, the pair of electrodes attract the beam in turns with 180 degree phase difference. One advantage of this configuration is that the beam is excited by two electrodes instead of one so lower voltage is needed to induce mechanical vibration.

In this illustrated embodiment, the stiffness-to-mass ratio of the microbridge beam structure is increased by narrowing the center section of the microbridge beam. It has been found that reducing the mass at the center of the microbridge beam structure is also effective in increasing resonance frequency in a horizontally vibrating resonator.

As shown in FIG. 5B, the electrodes 504A and 504B are shaped to provide uniform gaps between the electrodes 504 and the lateral sides of the microbridge beam 502. In the case of horizontally vibrating MEM resonator, the power handling capacity is proportional to the length of the gaps between the beam and the electrodes. As seen by referring to FIG. 5B, the length of the gaps actually increased by narrowing the center section of the beam and matching the contour of the electrodes. In doing so, higher resonance frequency can be advantageously achieved without sacrificing any power handling capacity of the resonator. In fact, the power handling capacity of the resonator may increase slightly due to the fact that the relevant area between the electrodes and the beam actually increased.

The MEM resonator 500 shown in FIGS. 5A and 5B has various applications. For example, the resonator may be used in a bandpass micromechanical filter which may operate in the following manner. An electrode input signal is applied at input electrode and converted to an input force by an electromechanical transducer (e.g., an electrical field generating the input force). The electromechanical transducer induces mechanical vibration of the horizontal beam section 502 in a horizontal direction. The mechanical vibration comprises a mechanical signal. If the vibration of the resonator 500 is within the passband, the mechanical signal is passed. If the vibration of the input resonator is outside the passband of the filter, the mechanical signal is rejected. A passed mechanical signal at resonator is re-converted to electrical energy at an output transducer at output electrode for processing by, for example, subsequent transceiver stages.

In one aspect of this embodiment, uniform gaps are formed between the beam 502 and the electrodes 504A and 504B by matching the contour of the electrodes with the contour of the microbridge beam 502. The uniform gaps may be formed using any suitable technique. Exemplary methods of forming uniform gaps between beam and electrodes are described in a co-pending U.S. application Ser. No. 09/894,334, filed Jun. 27, 2001 to Qing Ma et al., entitled "Sacrificial layer technique to make gaps in MEMS applications."

Figure 6A:
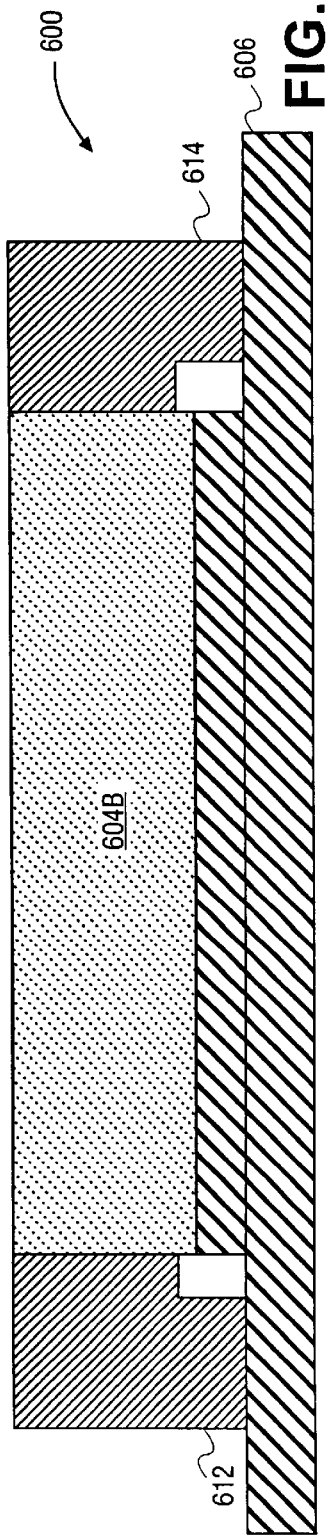
FIG. 6A shows a cross-sectional side elevational view of a MEM resonator according to a fifth embodiment of the invention.
Figure 6B:
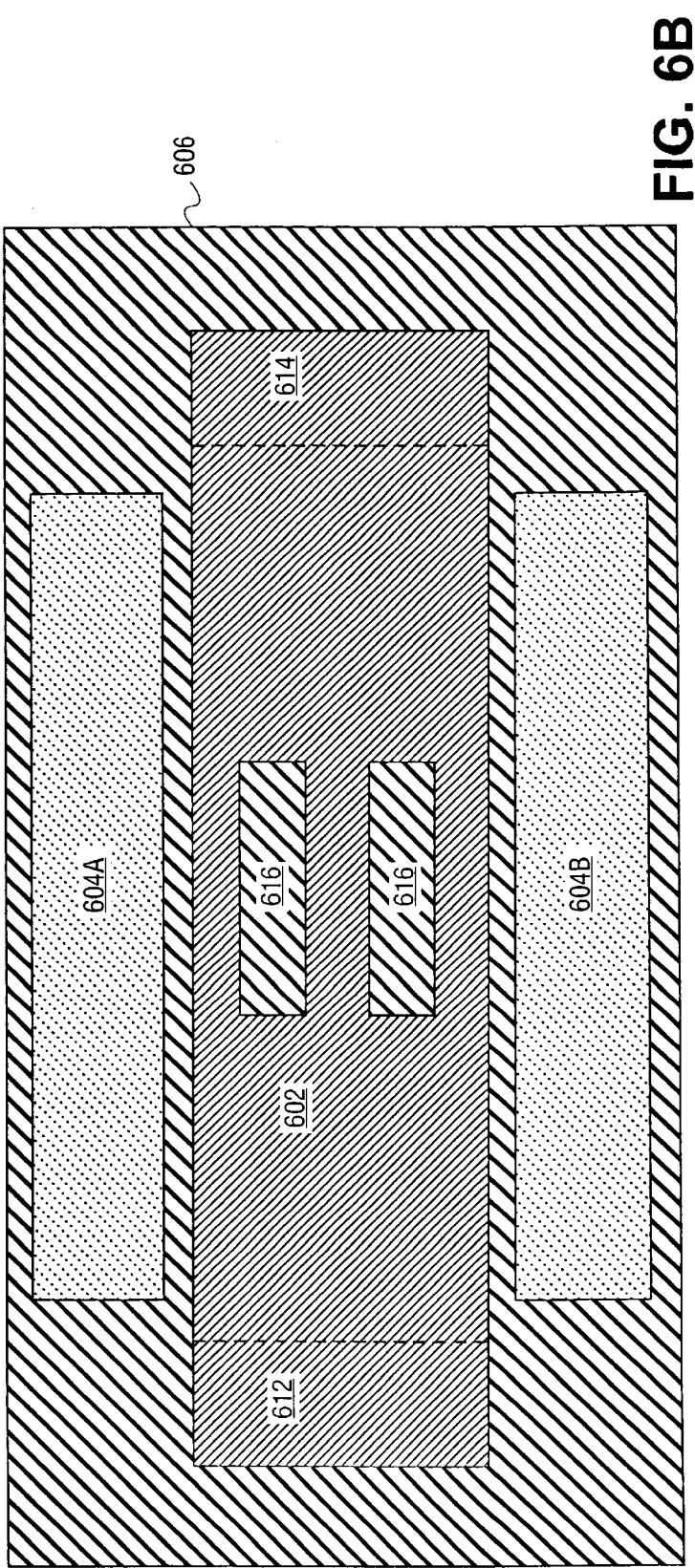
FIG. 6B shows a top view of the MEM resonator of FIG. 6A.

FIGS. 6A and 6B depict a MEM resonator 600 according to a fifth embodiment. This illustrated embodiment shows another way of reducing center-mass of the beam section 602 in a horizontally vibrating configuration. In this illustrated embodiment, one or more slots 616 are formed at or near the center section of the microbridge beam 602 to increase the stiffness-to-mass ratio of the microbridge beam structure so that higher resonance frequency can be achieved. As seen by referring to FIG. 6B, the power handling capacity of this resonator 600 is not significantly affected by the slots since the relevant area between the electrodes 604A and 604B and the beam 602 remain the same. As noted above, the amount of power the resonator 600 can handle is related to the length of the gaps between the electrodes 604A and 604B and the microbridge beam 602 and the thickness of the beam.

The embodiments illustrated and described in the specification depict various ways center-mass of a microbridge beam structure may be decreased to increase the resonance frequency without significantly affecting its power handling capacity. However, other suitable methods may also be employed to reduce the mass near the center of the beam structure without reducing the width near the support sections. Such is within the scope and contemplation of the present invention.

While the foregoing embodiments have been described and shown, it is understood that variations and modifications, such as those suggested and others within the spirit and scope of the invention, may occur to those skilled in the art to which the invention pertains. The scope of the present invention accordingly is to be defined as set forth in the appended claims.

What is claimed is:

1. A micro-electromechanical resonator comprising:
   a substrate;
   a microbridge beam structure coupled to said substrate, said microbridge beam structure including support sections and a beam formed between the support sections, wherein said beam is a portion of the microbridge beam structure capable of vibrating with respect to the substrate, wherein a center region of the beam has a mass that is less than mass of regions of the beam adjacent to the support sections, wherein dimensions of the beam are such that a resonance frequency generated by the microbridge beam structure is greater than 200 MHz; and at least one electrode disposed adjacent to said microbridge beam structure to induce vibration of said beam.

2. The resonator of claim 1, wherein said center mass-reduced beam has higher stiffness-to-mass ratio than if said beam were fabricated in a rectangular configuration.

3. The resonator of claim 1, wherein said center mass-reduced beam provides higher resonating frequency than if said beam were fabricated in a rectangular configuration.

4. The resonator of claim 1, wherein said center region of said beam is narrower than said regions adjacent to said support sections.

5. The resonator of claim 1, wherein said center region of said microbridge beam includes at least one slot formed therein.

6. The resonator of claim 1, wherein said center region of said microbridge beam includes at least one hole etched therein.

7. The resonator of claim 1, wherein said at least one electrode is disposed underneath the beam to induce vertical vibration of the beam.

8. The resonator of claim 1, wherein said at least one electrode comprises a pair of electrodes disposed adjacent to the beam to induce horizontal vibration of the beam, the beam and the electrodes are arranged such that a uniform gap is formed between each electrode and the beam.

9. A method comprising:
providing a microbridge structure having a rectangular-shaped beam coupled to at least one support section on a substrate, said beam being a portion of the microbridge structure capable of vibrating with respect to the substrate, wherein dimensions of the rectangular-shaped beam are such that a resonance frequency generated by the microbridge structure is greater than 200 MHz; and increasing a resonating frequency of the rectangular-shaped beam by increasing a stiffness-to-mass ratio of the beam.

10. The method of claim 9, wherein increasing the stiffness-to-mass ratio of the microbridge beam comprises reducing the mass at the center section of the microbridge beam.

11. The method of claim 9, wherein increasing the stiffness-to-mass ratio of the microbridge beam comprises increasing an effective spring constant of the microbridge beam.

12. The method of claim 9, wherein increasing the stiffness-to-mass ratio of the microbridge beam comprises narrowing the center section of the microbridge beam.

13. The method of claim 9, wherein increasing the stiffness-to-mass ratio of the microbridge beam comprises forming at least one slot in the center region of the microbridge beam.

14. The method of claim 9, wherein increasing the stiffness-to-mass ratio of the microbridge beam comprises etching at least one hole in the center region of the microbridge beam.

15. An apparatus comprising:
at least one support structure; and
a microbridge beam coupled to said at least one support structure and movable with respect to a substrate on which the support structure is formed along an axis, said beam including a center region that has relatively less mass than a region adjacent to said at least one support structure to form a center mass-reduced beam having higher stiffness-to-mass ratio than if said beam were fabricated in a rectangular configuration, wherein dimensions of the microbridge beam are such that a resonance frequency generated by the microbridge beam is greater than 200 MHz.

16. The apparatus of claim 15, wherein said center mass-reduced beam provides higher resonating frequency than if said beam were fabricated in a rectangular configuration.

17. The apparatus of claim 15, wherein said beam is integrally formed with said at least one support structure.

18. The apparatus of claim 15, wherein said center region of said microbridge beam is narrower than said region adjacent to said at least one support structure.

19. The apparatus of claim 15, wherein said center region of said microbridge beam includes at least one slot formed therein.

20. The apparatus of claim 15, wherein said center region of said microbridge beam includes at least one hole etched therein.

21. The apparatus of claim 15, wherein said microbridge beam is configured to move up and down with respect to the substrate.

22. The apparatus of claim 15, wherein said microbridge beam is configured to move horizontally with respect to the substrate.

23. The resonator of claim 1, wherein the support sections of the microbridge beam structure providing vertical support for the beam are integrally formed with the beam.

24. The resonator of claim 1, wherein the resonance frequency of the microbridge beam structure is greater than 1 GHz.

25. The resonator of claim 1, wherein the support structures and beam of the microbridge beam structure are constructed of polycrystalline silicon.

26. The method of claim 9, wherein the at least one support section and the beam are constructed of polycrystalline silicon.

27. The apparatus of claim 15, wherein the resonance frequency of the microbridge beam is greater than 1 GHz.

28. The apparatus of claim 15, wherein the at least one support structure and the beam are constructed of polycrystalline silicon.

29. A very high frequency (VHF) vibrating micro-electromechanical (MEM) resonator comprising:
a substrate;
a microbridge beam structure coupled to said substrate, said microbridge beam structure including support sections and a beam formed between the support sections, wherein said beam is a portion of the microbridge beam structure capable of vibrating with respect to the substrate, wherein a center region of the beam has a mass that is less than mass of regions of the beam adjacent to the support sections, wherein dimensions of the beam are such that a resonance frequency generated by the microbridge beam structure is the range between 30 and 200 MHz; and
at least one electrode disposed adjacent to said microbridge beam structure to induce vibration of said beam.

30. The resonator of claim 1, wherein a length of the beam is less than 3 microns.

31. The resonator of claim 9, wherein a length of the beam is less than 3 microns.

32. The apparatus of claim 15, wherein a length of the beam is less than 3 microns.

* * * * *

UNITED STATES PATENT AND TRADEMARK OFFICE
CERTIFICATE OF CORRECTION

PATENT NO.    : 6,630,871 B2
DATED         : October 7, 2003
INVENTOR(S)   : Ma et al.

It is certified that error appears in the above-identified patent and that said Letters Patent is hereby corrected as shown below:

Column 3,
Line 23, delete "(em)", insert -- ($\mu$m) --.

Signed and Sealed this

Sixth Day of January, 2004

JAMES E. ROGAN
*Director of the United States Patent and Trademark Office*